(12) United States Patent
Inishi

(10) Patent No.: US 12,028,988 B2
(45) Date of Patent: Jul. 2, 2024

(54) PRINTED WIRING BOARD

(71) Applicant: IBIDEN CO., LTD., Gifu (JP)

(72) Inventor: Takuya Inishi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 18/338,737

(22) Filed: Jun. 21, 2023

(65) Prior Publication Data

US 2023/0422406 A1 Dec. 28, 2023

(30) Foreign Application Priority Data

Jun. 22, 2022 (JP) .................................. 2022-100321

(51) Int. Cl.
| | |
|---|---|
| *B32B 3/02* | (2006.01) |
| *H05K 3/18* | (2006.01) |
| *H05K 3/38* | (2006.01) |
| *H05K 3/42* | (2006.01) |

(52) U.S. Cl.
CPC ............. *H05K 3/387* (2013.01); *H05K 3/188* (2013.01); *H05K 3/429* (2013.01)

(58) Field of Classification Search
CPC ............................... H05K 1/185; H05K 1/186
See application file for complete search history.

(56) References Cited

U.S. PATENT DOCUMENTS

2023/0292448 A1* 9/2023 Wada ....................... H05K 3/38

FOREIGN PATENT DOCUMENTS

JP 2010-087508 A 4/2010

* cited by examiner

*Primary Examiner* — Elizabeth E Mulvaney
(74) *Attorney, Agent, or Firm* — Oblon, McClelland, Maier & Neustadt, L.L.P.

(57) ABSTRACT

A printed wiring board includes an insulating layer, a conductor layer formed on the insulating layer and including one or more conductor circuits, an insulating adhesive layer covering a surface of the conductor layer and a part or parts of the insulating layer exposed from the conductor layer, and a resin insulating layer formed on the insulating layer and the conductor layer such that the insulating adhesive layer is sandwiched between the conductor layer and the resin insulating layer. The insulating adhesive layer includes a first portion covering an upper surface of the one or more conductor circuits and a second portion covering a side surface of the one or more conductor circuits and a thickness of the first portion is greater than a thickness of the second portion.

20 Claims, 4 Drawing Sheets

PRINTED WIRING BOARD

CROSS-REFERENCE TO RELATED APPLICATIONS

The present application is based upon and claims the benefit of priority to Japanese Patent Application No. 2022-100321, filed Jun. 22, 2022, the entire contents of which are incorporated herein by reference.

BACKGROUND OF THE INVENTION

Field of the Invention

The present invention relates to a printed wiring board.

Description of Background Art

Japanese Patent Application Laid-Open Publication No. 2010-87508 describes a multi-layer printed wiring board that includes: a core substrate; a first conductor circuit formed on the core substrate; an interlayer insulating layer formed on the core substrate and the first conductor circuit; and a second conductor circuit formed on the insulating layer. The entire contents of this publication are incorporated herein by reference.

SUMMARY OF THE INVENTION

According to one aspect of the present invention, a printed wiring board includes an insulating layer, a conductor layer formed on the insulating layer and including one or more conductor circuits, an insulating adhesive layer covering a surface of the conductor layer and a part or parts of the insulating layer exposed from the conductor layer, and a resin insulating layer formed on the insulating layer and the conductor layer such that the insulating adhesive layer is sandwiched between the conductor layer and the resin insulating layer. The insulating adhesive layer includes a first portion covering an upper surface of the one or more conductor circuits and a second portion covering a side surface of the one or more conductor circuits and a thickness of the first portion is greater than a thickness of the second portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
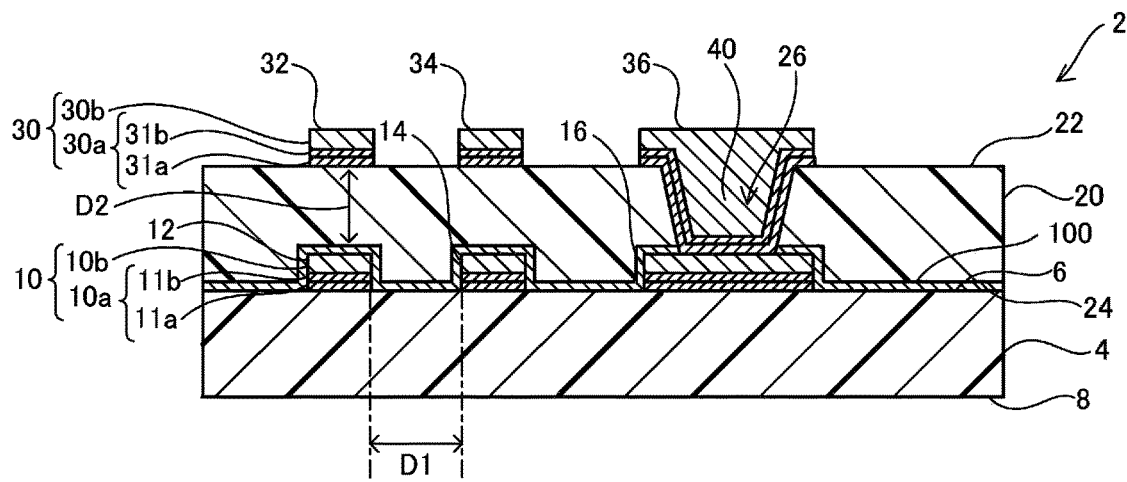
FIG. 1 is a cross-sectional view schematically illustrating a printed wiring board according to an embodiment of the present invention.

Embodiments will now be described with reference to the accompanying drawings, wherein like reference numerals designate corresponding or identical elements throughout the various drawings.

Embodiment

Figure 2:
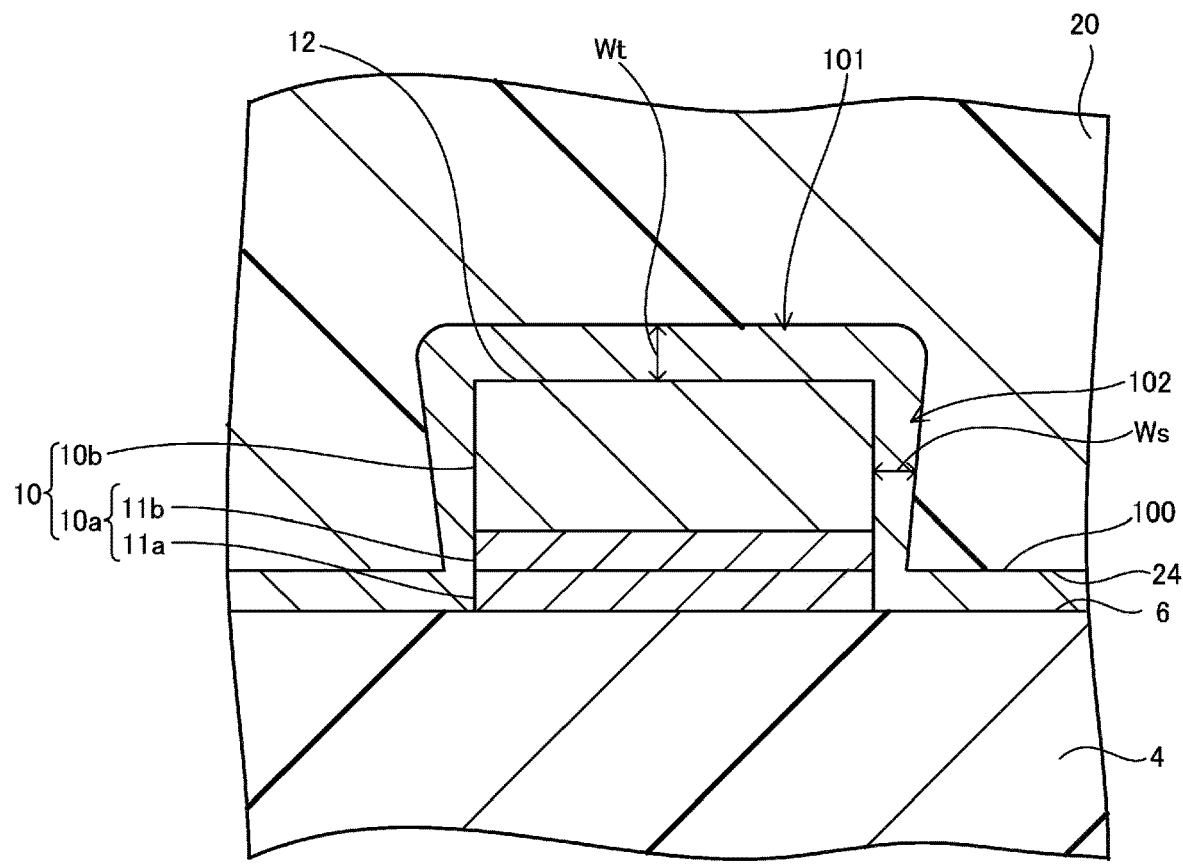
FIG. 2 is an enlarged cross-sectional view schematically illustrating a part of a printed wiring board according to an embodiment of the present invention.

FIG. 1 is a cross-sectional view illustrating a printed wiring board 2 according to an embodiment of the present invention. FIG. 2 is an enlarged cross-sectional view illustrating a part of the printed wiring board 2 of the embodiment. As illustrated in FIG. 1, the printed wiring board 2 includes an insulating layer 4, a first conductor layer 10, a resin insulating layer 20, a second conductor layer 30, and a via conductor 40.

The insulating layer 4 is formed using a thermosetting resin. The insulating layer 4 may be formed of a photocurable resin. The insulating layer 4 may contain inorganic particles such as silica particles. The insulating layer 4 may contain a reinforcing material such as a glass cloth. The insulating layer 4 has a third surface 6 (upper surface in the drawing) and a fourth surface 8 (lower surface in the drawing) on the opposite side with respect to the third surface 6.

The first conductor layer 10 is formed on the third surface 6 of the insulating layer 4. The first conductor layer 10 includes a first signal wiring 12, a second signal wiring 14, and a pad 16. Although not illustrated in the drawing, the first conductor layer 10 also includes conductor circuits other than the first signal wiring 12, the second signal wiring 14, and the pad 16. The first signal wiring 12 and the second signal wiring 14 form a pair wiring. The first signal wiring 12 and the second signal wiring 14 are adjacent to each other. A distance (D1) between the first signal wiring 12 and the second signal wiring 14 is 1.5 μm or more and 6 μm or less. The first signal wiring 12 and the second signal wiring 14 are examples of "two adjacent conductor circuits." Surfaces of the first signal wiring 12, the second signal wiring 14, and the pad 16 are formed with low roughness. A root mean square height (SqAve) of the surfaces of the first signal wiring 12, the second signal wiring 14, and the pad 16 is 0.050 μm or more and 0.200 μm or less.

The first conductor layer 10 is mainly formed of copper. The first conductor layer 10 is formed of a seed layer (10a) on the insulating layer 4 and an electrolytic plating film (10b) on the seed layer (10a). The seed layer (10a) is formed of a first layer (11a) on the third surface 6 and a second layer (11b) on the first layer (11a). The first layer (11a) is formed of an alloy (copper alloy) containing copper, silicon and aluminum. The second layer (11b) is formed of copper. The electrolytic plating film (10b) is formed of copper. The first layer (11a) is in contact with the insulating layer 4.

A content of copper in the copper alloy forming the first layer (11a) is greater than at %. The content of copper in the copper alloy of the first layer (11a) is less than 99 at %. The content of copper in the copper alloy is 98 at % or less. A content of copper forming the second layer (11b) is 99.9 at % or more. The content of copper in the second layer (11b) is preferably 99.95 at % or more.

A surface of the first conductor layer 10 is formed of a first surface and a second surface. The first surface is exposed from an opening 26 and is not covered by an insulating adhesive layer 100. The second surface is a portion other than the first surface and is covered by the insulating adhesive layer 100. That is, the surface of the first conductor layer 10 is covered by the insulating adhesive layer 100 except for the portion (first surface) exposed from the opening 26. Further, the third surface of the insulating layer 4 exposed from the first conductor layer 10 is covered by the insulating adhesive layer 100.

The insulating adhesive layer 100 contains silicon, nitrogen, and oxygen. The insulating adhesive layer 100 is a silicon nitride layer. In another example, the insulating adhesive layer 100 is a mixed layer of silicon nitride and silicon oxide. The insulating adhesive layer 100 serves to electrically insulate the first conductor layer 10 and the second conductor layer 30 from each other, and to adhere the first conductor layer 10 and the resin insulating layer 20 together. The insulating adhesive layer 100 has a uniform density and a uniform composition. A compound of silicon nitride and silicon oxide is uniformly distributed. The insulating adhesive layer 100 is a sputtering film formed by sputtering.

FIG. 2 illustrates the first signal wiring 12 and the insulating adhesive layer 100 covering the surface of the first signal wiring 12. As illustrated in FIG. 2, the insulating adhesive layer 100 covering the surface of the first signal wiring 12 includes a first portion 101 covering an upper surface of the first signal wiring 12 and a second portion 102 covering a side surface of the first signal wiring 12.

As illustrated in FIG. 2, a thickness (Wt) of the first portion 101 is greater than a thickness (Ws) of the second portion 102. The thickness (Ws) of the second portion 102 is 15% or more and 50% or less of the thickness (Wt) of the first portion 101. The thickness (Wt) of the first portion 101 is 50 nm or more and 500 nm or less. The thickness (Ws) of the second portion 102 is 15 nm or more and 200 nm or less. Further, the thickness (Ws) of the second portion 102 decreases from the upper surface toward a lower surface of the first signal wiring 12. The thickness (Ws) of the second portion 102 is greater near the upper surface of the first signal wiring 12 than near the lower surface of the first signal wiring 12.

Although not illustrated in FIG. 2, the second signal wiring 14 and the insulating adhesive layer 100 covering the surface of the second signal wiring 14 also have the same structure as the first signal wiring 12 and the insulating adhesive layer 100 covering the surface of the first signal wiring 12 (FIG. 2).

As illustrated in FIG. 1, the resin insulating layer 20 is formed on the third surface 6 of the insulating layer 4 and the first conductor layer 10 via the insulating adhesive layer 100.

The insulating adhesive layer 100 is sandwiched between the first conductor layer 10 and the resin insulating layer 20. The resin insulating layer 20 has a first surface 22 (upper surface in the drawing) and a second surface 24 (lower surface in the drawing) on the opposite side with respect to the first surface 22. The second surface 24 of the resin insulating layer 20 faces the first conductor layer 10. The resin insulating layer 20 has the opening 26 that exposes the pad 16. The resin insulating layer 20 is formed of an epoxy resin and inorganic particles dispersed in the epoxy resin. Examples of the resin include a thermosetting resin and a photocurable resin. Examples of the inorganic particles include silica particles and alumina particles. An amount of the inorganic particles in the resin insulating layer 20 is 70 wt % or more and 85 wt % or less.

The inorganic particles are substantially not exposed on the first surface 22 of the resin insulating layer 20. Therefore, the first surface 22 is formed substantially smooth. An inner wall surface of the opening 26 is formed of flat surfaces of the resin and the inorganic particles. The inner wall surface is formed smooth. The flat surfaces of the inorganic particles are obtained by cutting spherical inorganic particles along a plane.

The second conductor layer 30 is formed on the first surface 22 of the resin insulating layer 20. The second conductor layer 30 includes a third signal wiring 32, a fourth signal wiring 34, and a land 36. Although not illustrated, the second conductor layer 30 also includes conductor circuits other than the third signal wiring 32, the fourth signal wiring 34 and the land 36. The third signal wiring 32 and the fourth signal wiring 34 form a pair wiring. The second conductor layer 30 is mainly formed of copper. The second conductor layer 30 is formed by a seed layer (30a) on the first surface 22 and an electrolytic plating film (30b) on the seed layer (30a). The seed layer (30a) is formed of a first layer (31a) on the first surface 22 and a second layer (31b) on the first layer (31a). The first layer (31a) is formed of an alloy (copper alloy) containing copper, silicon and aluminum. The second layer (31b) is formed of copper. The electrolytic plating film (30b) is formed of copper. The first layer (31a) is in contact with the first surface 22.

A content of copper in the copper alloy forming the first layer (31a) is greater than at %. The content of copper in the copper alloy of the first layer (31a) is less than 99 at %. The content of copper in the copper alloy is 98 at % or less. A content of copper forming the second layer (31b) is 99.9 at % or more. The content of copper in the second layer (31b) is preferably 99.95 at % or more.

As illustrated in FIG. 1, a distance (D2) between an upper surface of the first conductor layer 10 and a lower surface of the second conductor layer 30 is 1 μm or more and 6 μm or less.

The via conductor 40 is formed in the opening 26. The via conductor 40 connects the first conductor layer 10 and the second conductor layer 30. In FIG. 1, the via conductor 40 connects the pad 16 and the land 36. The via conductor 40 is formed of a seed layer (30a) and an electrolytic plating film (30b) on the seed layer (30a).

Method for Manufacturing Printed Wiring Board

Figure 3A:
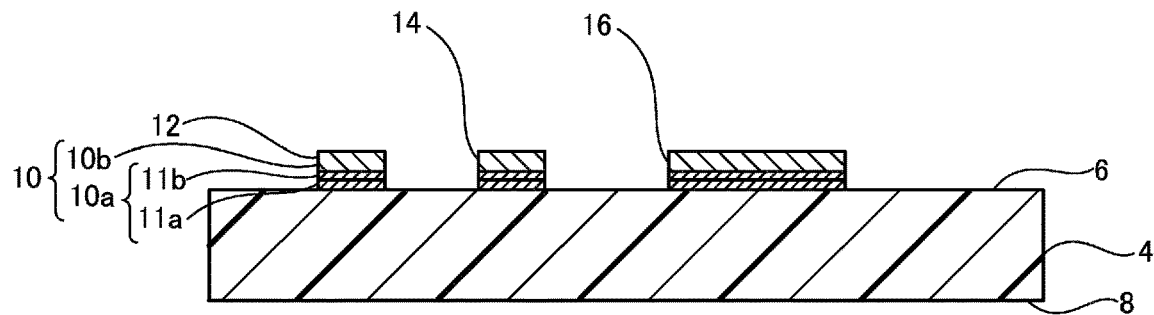
FIG. 3A is a cross-sectional view schematically illustrating a method for manufacturing a printed wiring board according to an embodiment of the present invention.

FIGS. 3A-3I illustrate a method for manufacturing the printed wiring board 2 of the embodiment. FIGS. 3A-3I are cross-sectional views. FIG. 3A illustrates the insulating layer 4 and the first conductor layer 10 formed on the third surface 6 of the insulating layer 4. The first conductor layer 10 is formed using a semi-additive method.

Figure 3B:
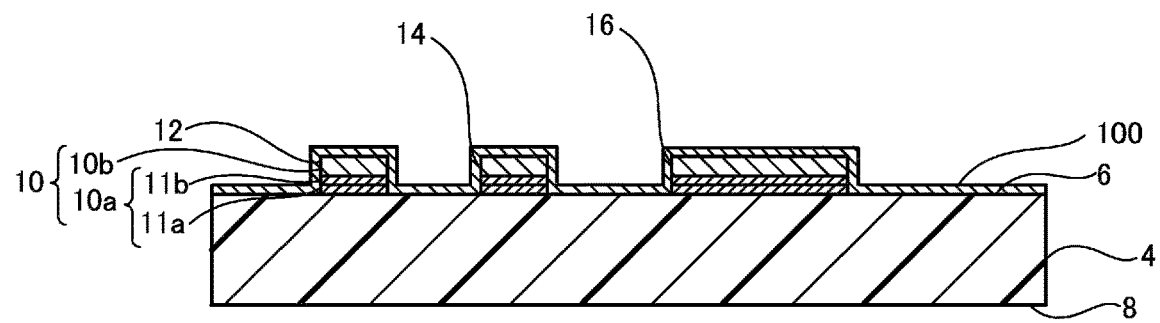
FIG. 3B is a cross-sectional view schematically illustrating a method for manufacturing a printed wiring board according to an embodiment of the present invention.

As illustrated in FIG. 3B, the insulating adhesive layer 100 is formed on the surface of the first conductor layer 10 and the third surface of the insulating layer 4 exposed from the first conductor layer 10. The insulating adhesive layer 100 is formed by sputtering. As illustrated in FIG. 2, the insulating adhesive layer 100 includes the first portion 101 covering the upper surface of the first signal wiring 12 and the second portion 102 covering the side surface of the first signal wiring 12. The thickness (Wt) of the first portion 101 is greater than the thickness (Ws) of the second portion 102. The thickness (Ws) of the second portion 102 is 15% or more and 50% or less of the thickness (Wt) of the first portion 101. The thickness (Wt) of the first portion 101 is 50 nm or more and 500 nm or less. The thickness (Ws) of the second portion 102 is 15 nm or more and 200 nm or less. The thickness (Ws) of the second portion 102 decreases from the upper surface toward the lower surface of the first signal wiring 12. Although not illustrated in FIG. 2, the second signal wiring 14 and the insulating adhesive layer 100 covering the surface of the second signal wiring 14 also have the same structure.

Figure 3C:
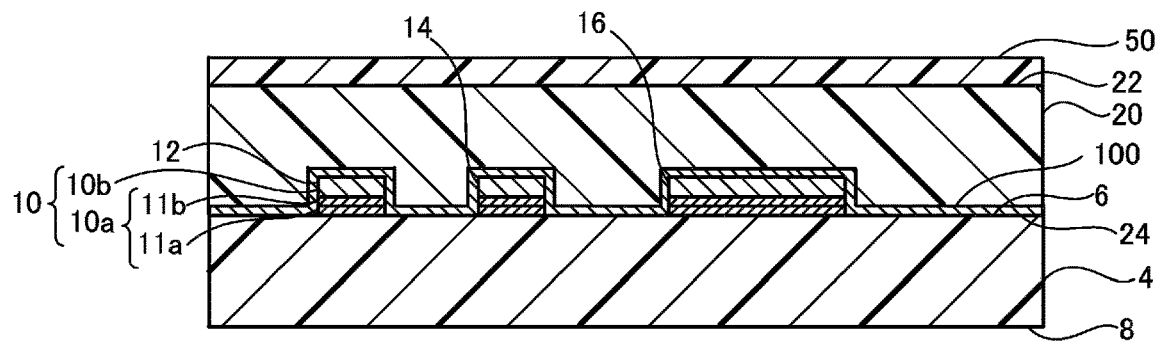
FIG. 3C is a cross-sectional view schematically illustrating a method for manufacturing a printed wiring board according to an embodiment of the present invention.

As illustrated in FIG. 3C, the resin insulating layer 20 and a protective film 50 are formed on the insulating layer 4 and the first conductor layer 10, which are covered by the insulating adhesive layer 100. The second surface 24 of the resin insulating layer 20 faces the third surface 6 of the insulating layer 4 via the insulating adhesive layer 100. The protective film 50 is formed on the first surface 22 of the resin insulating layer 20.

The protective film 50 completely covers the first surface 22 of the resin insulating layer 20. An example of the protective film 50 is a film formed of polyethylene terephthalate (PET). A release agent is formed between the protective film 50 and the resin insulating layer 20.

Figure 3D:
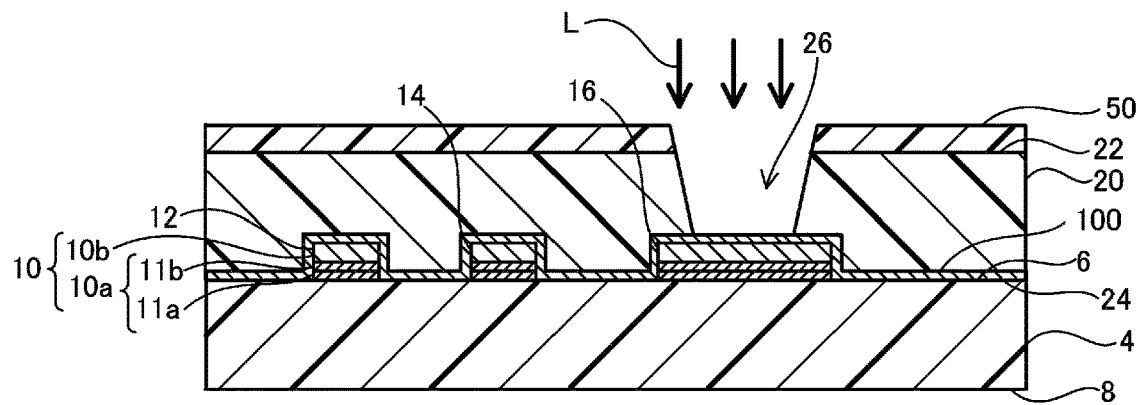
FIG. 3D is a cross-sectional view schematically illustrating a method for manufacturing a printed wiring board according to an embodiment of the present invention.

As illustrated in FIG. 3D, laser (L) is irradiated from above the protective film 50. The laser (L) penetrates the protective film 50 and the resin insulating layer 20 at the same time. The opening 26 for a via conductor reaching the insulating adhesive layer 100 covering the pad 16 is formed. The laser (L) is, for example, UV laser, or CO2 laser. The insulating adhesive layer 100 is not completely removed by the laser (L). The insulating adhesive layer 100 covering the pad 16 is exposed by the opening 26. When the opening 26 is formed, the first surface 22 is covered by the protective film 50. Therefore, when the opening 26 is formed, even when the resin scatters, adherence of the resin to the first surface 22 is suppressed.

Figure 3E:
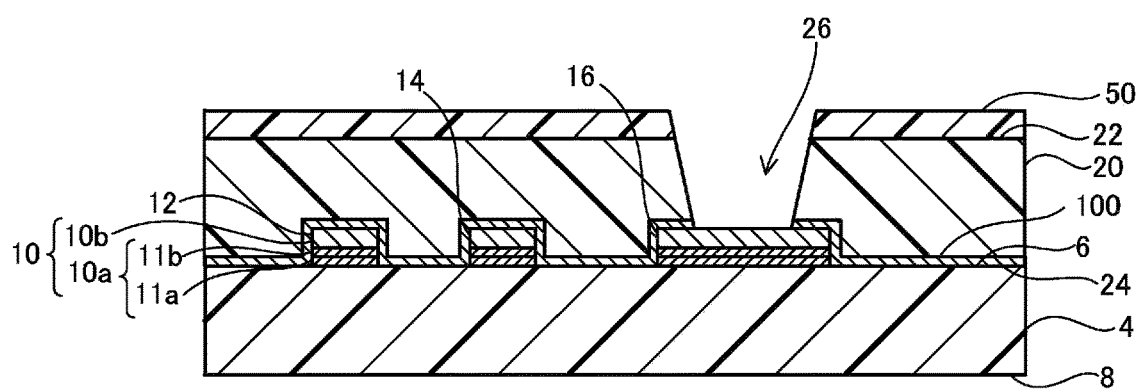
FIG. 3E is a cross-sectional view schematically illustrating a method for manufacturing a printed wiring board according to an embodiment of the present invention.

As illustrated in FIG. 3E, inside of the opening 26 is cleaned. The insulating adhesive layer 100 exposed from the opening 26 is removed by cleaning the inside of the opening 26. The pad 16 is exposed from the opening 26. Resin residues generated when the opening 26 is formed are removed. The cleaning of the inside of the opening 26 is performed using plasma. That is, the cleaning is performed in a dry process. The cleaning includes a desmear treatment. The insulating adhesive layer 100 formed between the second surface 24 of the resin insulating layer 20 and the pad 16 is not removed. Therefore, no gap is formed between the second surface 24 of the resin insulating layer 20 and the pad 16. The inorganic particles protruding from the resin are selectively removed by plasma. Due to the effect of the plasma, the spherical inorganic particles protruding from the inner wall surface of the opening 26 when the opening 26 is formed are cut along a plane and flat portions are formed. As a result, the inner wall surface of the opening 26 is formed smooth by the resin forming the resin insulating layer 20 and the flat portions of the inorganic particles. On the other hand, the first surface 22 of the resin insulating layer is covered by the protective film 50. The first surface 22 is not affected by the plasma. No unevenness is formed on the first surface 22 of the resin insulating layer 20.

Figure 3F:
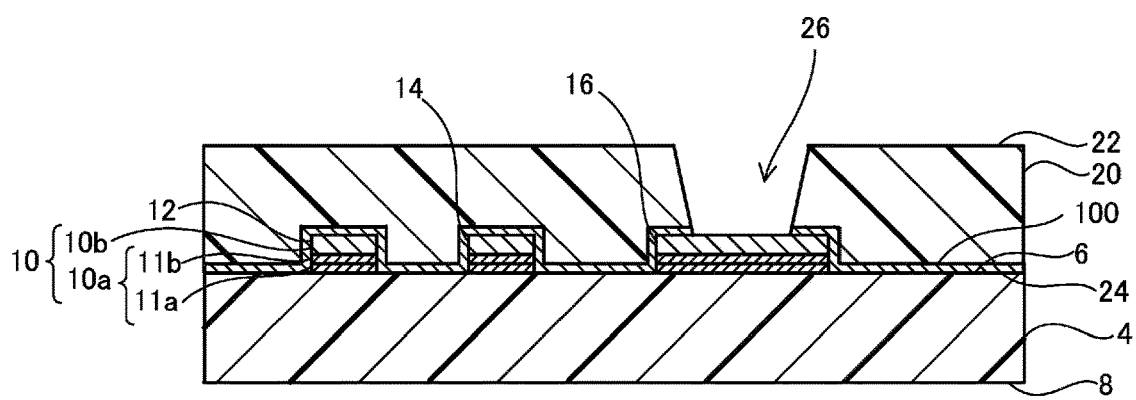
FIG. 3F is a cross-sectional view schematically illustrating a method for manufacturing a printed wiring board according to an embodiment of the present invention.

As illustrated in FIG. 3F, the protective film 50 is removed from the resin insulating layer 20. After the removal of the protective film 50, the first surface 22 of the resin insulating layer 20 is cleaned. The first surface 22 is dry etched. The dry etching is performed by sputtering using argon gas (argon sputtering). Due to the dry etching, the inorganic particles are slightly exposed on the first surface 22. The first surface 22 is formed substantially smooth. Roughening of the first surface 22 of the resin insulating layer 20 is not performed.

Figure 3G:
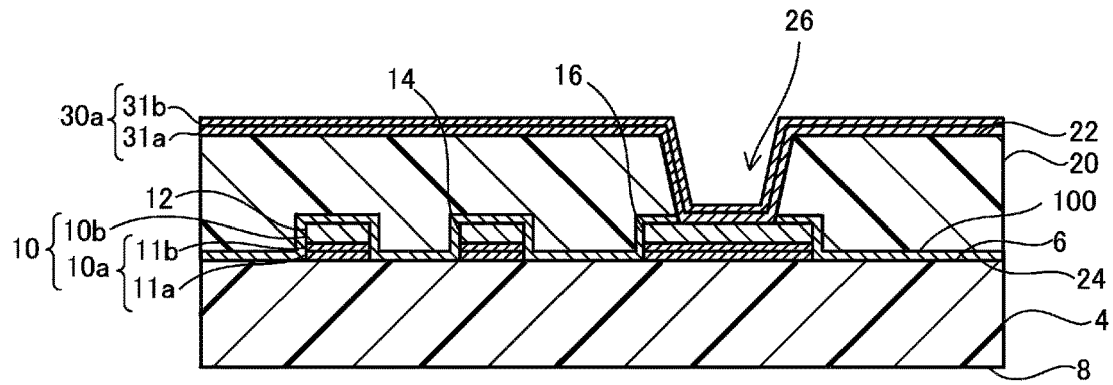
FIG. 3G is a cross-sectional view schematically illustrating a method for manufacturing a printed wiring board according to an embodiment of the present invention.

As illustrated in FIG. 3G, the seed layer (30a) is formed on the first surface 22 of the resin insulating layer 20. The seed layer (30a) is formed by sputtering. The formation of the seed layer (30a) is performed in a dry process. The first layer (31a) is formed on the first surface 22. At the same time, the first layer (31a) is formed on the inner wall surface and the pad 16, which are exposed from the opening 26. After that, the second layer (31b) is formed on the first layer (31a). The seed layer (30a) is also formed on the upper surface of the pad 16 exposed from the opening 26 and on the inner wall surface of the opening 26. The first layer (31a) is formed of an alloy containing copper, silicon and aluminum. The second layer (31b) is formed of copper.

Figure 3H:
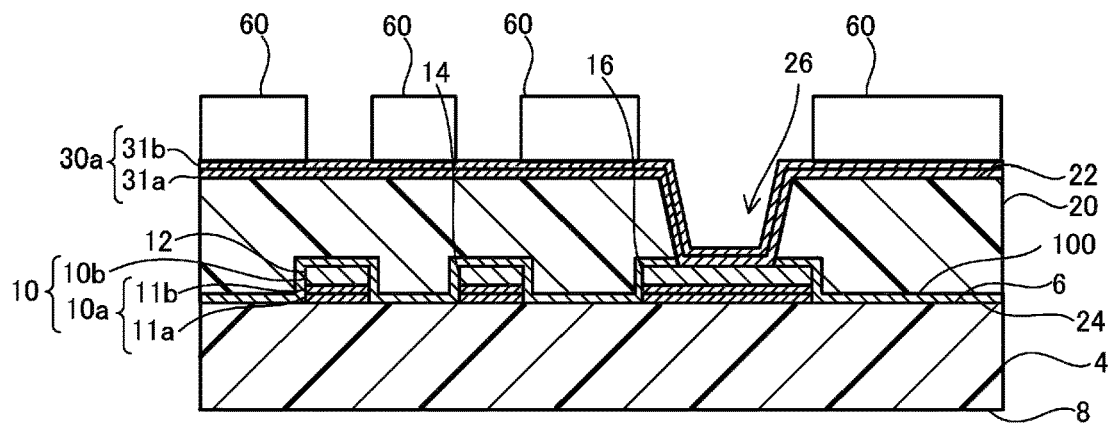
FIG. 3H is a cross-sectional view schematically illustrating a method for manufacturing a printed wiring board according to an embodiment of the present invention.

As illustrated in FIG. 3H, a plating resist 60 is formed on the seed layer (30a). The plating resist 60 has openings for forming the third signal wiring 32, the fourth signal wiring 34, and the land 36 (FIG. 1).

Figure 3I:
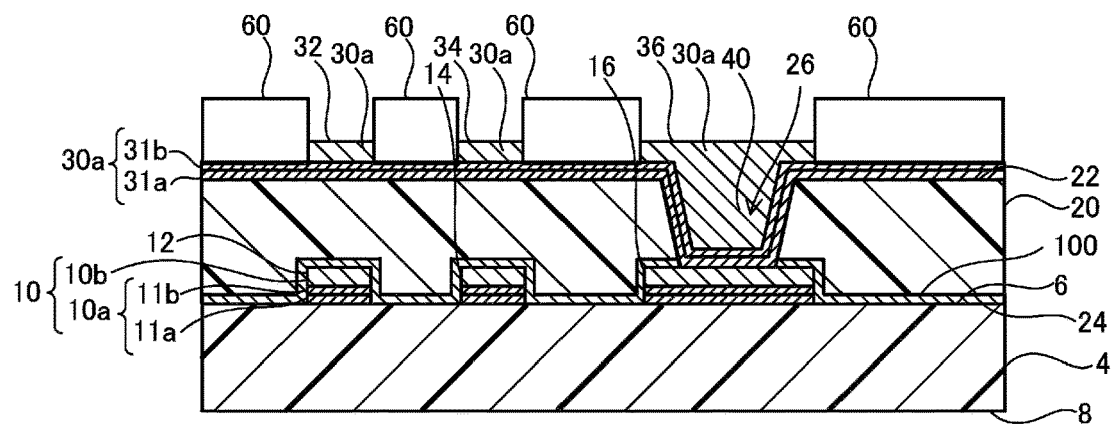
FIG. 3I is a cross-sectional view schematically illustrating a method for manufacturing a printed wiring board according to an embodiment of the present invention.

As illustrated in FIG. 3I, the electrolytic plating film (30b) is formed on the seed layer (30a) exposed from the plating resist 60. The electrolytic plating film (30b) is formed of copper. The electrolytic plating film (30b) fills the opening 26. The third signal wiring 32, the fourth signal wiring 34, and the land 36 are formed by the seed layer (30a) and the electrolytic plating film (30b) on the first surface 22. The second conductor layer 30 is formed. The via conductor 40 is formed by the seed layer (30a) and the electrolytic plating film (30b) in the opening 26. The via conductor 40 connects the pad 16 and the land 36. The third signal wiring 32 and the fourth signal wiring 34 form a pair wiring.

After that, the plating resist 60 is removed. The seed layer (30a) exposed from the electrolytic plating film (30b) is removed. The second conductor layer 30 and the via conductor 40 are formed at the same time. The printed wiring board 2 (FIG. 1) of the embodiment is obtained.

In printed wiring board 2 of the embodiment (FIGS. 1 and 2), the thickness (Wt) of the first portion 101 of the insulating adhesive layer 100 is greater than the thickness (Ws) of the second portion 102. Since the second portion 102 covering the side surfaces of the conductor circuits (the first signal wiring 12, and the second signal wiring 14) is thin, the distance (D1) between the adjacent first signal wiring 12 and second signal wiring 14 of the first conductor layer 10 is reduced. The conductive circuits (the first signal wiring 12, and the second signal wiring 14) are formed at a high density. On the other hand, since the first portion 101 covering the upper surfaces of the conductor circuits (the first signal wiring 12, and the second signal wiring 14) is thick, insulation between the first conductor layer 10 and the second conductor layer 30 is ensured. Since it is not necessary to form the resin insulating layer 20 thick, the thickness of the printed wiring board 2 is reduced. Therefore, according to the structure of the embodiment, a printed wiring board 2 having conductor circuits at a high density and having a reduced thickness is provided.

Another Example of Embodiment

In another example of the embodiment, the first layers (11a, 31a) of the seed layers (10a, 30a) are each formed of copper and a second element. The second element is selected from silicon, aluminum, titanium, nickel, chromium, carbon, oxygen, tin, and calcium. The first layers (11a, 31a) are each formed of an alloy containing copper. The second layers (11b, 31b) are each formed of copper. An amount of copper forming each of the second layers (11b, 31b) is 99.9 at % or more, and preferably 99.95 at % or more.

Japanese Patent Application Laid-Open Publication No. 2010-87508 describes a multi-layer printed wiring board that includes: a core substrate; a first conductor circuit formed on the core substrate; an interlayer insulating layer formed on the core substrate and the first conductor circuit; and a second conductor circuit formed on the insulating layer. An insulating thin film is formed on a surface of the first conductor circuit.

It is thought that in the Japanese Patent Application Laid-Open Publication No. 2010-87508, the thickness of the insulating thin film is constant regardless of a location. Therefore, it is thought that when the insulating thin film is thick, it is difficult to reduce a distance between wirings in the first conductor circuit. It is thought that it is difficult to form wirings at a high density. On the other hand, it is thought that when the insulating thin film is thin, insulation performance between the first conductor circuit and the second conductor circuit may decrease. It is thought that since the interlayer insulating layer needs to be thickened, the entire multilayer printed wiring board becomes thicker, and thus it is difficult to reduce the thickness of the printed wiring board.

A printed wiring board according to an embodiment of the present invention includes: an insulating layer; a first conductor layer that is formed on the insulating layer and includes one or more conductor circuits; an insulating adhesive layer that covers a surface of the first conductor layer and the insulating layer exposed from the first conductor layer; a resin insulating layer that is formed on the insulating layer and the first conductor layer; and a second conductor layer that is formed on the resin insulating layer. The insulating adhesive layer is sandwiched between the first conductor layer and the resin insulating layer and includes a first portion covering an upper surface of the at least one conductor circuit and a second portion covering a side surface of the at least one conductor circuit. A thickness of the first portion is greater than a thickness of the second portion.

In a printed wiring board according to an embodiment of the present invention, the thickness of the first portion of the insulating adhesive layer is greater than the thickness of the second portion. Since the second portion covering the side surface of each conductor circuit is thin, a distance between adjacent conductor circuits in the first conductor layer is reduced. Conductive circuits are formed with a high density. On the other hand, since the first portion covering the upper surface of each conductor circuit is thick, insulation between the first conductor layer and the second conductor layer is ensured. Since it is not necessary to form an interlayer insulating layer thick, the thickness of the printed wiring board is reduced. Therefore, according to the above structure, a printed wiring board having conductor circuits at a high density and having a reduced thickness is provided.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board comprising:
an insulating layer;
a conductor layer formed on the insulating layer and including at least one conductor circuit;
an insulating adhesive layer covering a surface of the conductor layer and part of the insulating layer exposed from the conductor layer; and
a resin insulating layer formed on the insulating layer and the conductor layer such that the insulating adhesive layer is sandwiched between the conductor layer and the resin insulating layer,
wherein the insulating adhesive layer includes a first portion covering an upper surface of the at least one conductor circuit and a second portion covering a side surface of the at least one conductor circuit and a thickness of the first portion is greater than a thickness of the second portion.

2. The printed wiring board according to claim 1, wherein the insulating adhesive layer is formed such that the thickness of the second portion is in a range of 15% to 50% of the thickness of the first portion.

3. The printed wiring board according to claim 1, wherein the insulating adhesive layer is formed such that the thickness of the second portion is decreasing from the upper surface of the at least one conductor circuit toward a lower surface of the at least one conductor circuit.

4. The printed wiring board according to claim 1, wherein the insulating adhesive layer is formed such that the thickness of the first portion is in a range of 50 nm to 500 nm, and that the thickness of the second portion is in a range of 15 nm to 200 nm.

5. The printed wiring board according to claim 1, wherein the insulating adhesive layer includes silicon, nitrogen and oxygen.

6. The printed wiring board according to claim 1, wherein the insulating adhesive layer is a silicon nitride layer or a mixed layer comprising silicon nitride and silicon oxide.

7. The printed wiring board according to claim 1, wherein the insulating adhesive layer has a uniform density and a uniform composition.

8. The printed wiring board according to claim 1, wherein the conductor layer is formed such that a root mean square height Rq of the at least one conductor circuit is in a range of 0.050 μm to 0.200 μm.

9. The printed wiring board according to claim 1, further comprising:
a second conductor layer formed on the resin insulating layer such that a distance between an upper surface of the conductor layer and a lower surface of the second conductor layer is in a range of 1 μm to 6 μm.

10. The printed wiring board according to claim 1, wherein the conductor layer is formed such that the at least one conductor circuit includes two adjacent conductor circuits such that a distance between the two adjacent conductor circuits is in a range of 1 μm to 6 μm.

11. The printed wiring board according to claim 1, wherein the resin insulating layer includes a resin and inorganic particles such that an amount of the inorganic particles in the resin insulating layer is in a range of 70 wt % to 85 wt %.

12. The printed wiring board according to claim 1, wherein the insulating adhesive layer is a sputtering film.

13. The printed wiring board according to claim 9, wherein the conductor layer is formed such that the at least one conductor circuit includes two adjacent conductor circuits such that a distance between the two adjacent conductor circuits is in a range of 1 μm to 6 μm.

14. The printed wiring board according to claim 2, wherein the insulating adhesive layer is formed such that the thickness of the second portion is decreasing from the upper surface of the at least one conductor circuit toward a lower surface of the at least one conductor circuit.

15. The printed wiring board according to claim 2, wherein the insulating adhesive layer is formed such that the thickness of the first portion is in a range of 50 nm to 500 nm, and that the thickness of the second portion is in a range of 15 nm to 200 nm.

16. The printed wiring board according to claim 2, wherein the insulating adhesive layer includes silicon, nitrogen and oxygen.

17. The printed wiring board according to claim 2, wherein the insulating adhesive layer is a silicon nitride layer or a mixed layer comprising silicon nitride and silicon oxide.

18. The printed wiring board according to claim 2, wherein the insulating adhesive layer has a uniform density and a uniform composition.

19. The printed wiring board according to claim 2, wherein the conductor layer is formed such that a root mean square height Rq of the at least one conductor circuit is in a range of 0.050 μm to 0.200 μm.

20. The printed wiring board according to claim 2, further comprising:

a second conductor layer formed on the resin insulating layer such that a distance between an upper surface of the conductor layer and a lower surface of the second conductor layer is in a range of 1 μm to 6 μm.

* * * * *